United States Patent [19]

Ueda et al.

[11] Patent Number: 5,323,070
[45] Date of Patent: Jun. 21, 1994

[54] OUTPUT BUFFER CIRCUIT HAVING OUTPUT BOUNCING CONTROLLED CIRCUITS

[75] Inventors: Masahiro Ueda; Ichiro Tomioka, both of Hyogo, Japan

[73] Assignee: Mitsubishi Denki Kabushiki Kaisha, Tokyo, Japan

[21] Appl. No.: 821,941

[22] Filed: Jan. 17, 1992

[30] Foreign Application Priority Data

Jan. 28, 1991 [JP] Japan .................................. 3-29406
Oct. 28, 1991 [JP] Japan .................................. 3-281520

[51] Int. Cl.⁵ .................... H03K 19/092; H03K 17/16
[52] U.S. Cl. ................................ 307/475; 307/443; 307/446; 307/448
[58] Field of Search ............... 307/475, 443, 446, 448

[56] References Cited

U.S. PATENT DOCUMENTS

| | | | |
|---|---|---|---|
| 4,779,013 | 10/1988 | Tanaka | 307/448 |
| 4,855,623 | 8/1989 | Flaherty | 307/475 |
| 4,890,016 | 12/1989 | Tanaka et al. | 307/443 |
| 5,066,875 | 11/1991 | Ueno et al. | 307/475 |
| 5,107,142 | 4/1992 | Bhamidipaty | 307/475 |
| 5,122,690 | 6/1992 | Bianchi | 307/475 |

FOREIGN PATENT DOCUMENTS

| | | |
|---|---|---|
| 0251910A2 | 1/1988 | European Pat. Off. . |
| 62-165426 | 7/1987 | Japan . |
| 2-4005 | 1/1990 | Japan . |
| 2-104018 | 4/1990 | Japan . |

OTHER PUBLICATIONS

Masahiro Kimura et al., Technical Research Report of the Institute of Electronics, Information and Communication Engineers, Jul 19, 1991, pp. 69-73 "A Low Noise, High Drivability Output Buffer for BiCMOS Standard Cell Libraries".

Kam Leung, "Controlled Slew Rate Output Buffer", IEEE 1988 Custom Integrated Circuits Conference, 1988, pp. 5.5.1-5.5.4.

Ichiro Tomioka et al., "Current Control Buffer for Multi Switching CMOS SOG", IEEE 1990 Custom Integrated Circuits Conference, pp. 11.7.1-11.7.4.

Primary Examiner—David R. Hudspeth
Assistant Examiner—Richard Roseen
Attorney, Agent, or Firm—Lowe, Price, LeBlanc & Becker

[57] ABSTRACT

A first output buffer having a large current driving capability and a second output buffer having a small current driving capability are connected in parallel between an input terminal and an external lead. The first and second output buffers each includes two CMOS inverters connected in series between the input terminal and the external lead. The P-channel and N-channel MOSFETs of the two CMOS inverters in the second output buffer have gate widths smaller than each of the P-channel and N-channel MOSFETs, respectively, of the two CMOS inverters in the first output buffer. Also disclosed is an output buffer having P-channel and N-channel MOSFETs arranged as a CMOS inverter, but with a base of a first bipolar transistor connected to a source of the N-channel MOSFET. An emitter of the first bipolar transistor is connected to ground and its collector is connected to an output of the output buffer. A base of a second bipolar transistor is connected to an output of the CMOS inverter and its emitter is connected to the output of the output buffer. An input of the output buffer is supplied to an input of the CMOS inverter. Another transistor is connected between the output of the output buffer and ground and is responsive to the input of the output buffer.

20 Claims, 11 Drawing Sheets

OUTPUT BUFFER CIRCUIT HAVING OUTPUT BOUNCING CONTROLLED CIRCUITS

BACKGROUND OF THE INVENTION

1. Field of the Invention

The present invention relates to an output buffer circuit particularly, but not exclusively, for a semiconductor integrated circuit device (LSI).

2. Description of the Related Art

Figure 10:
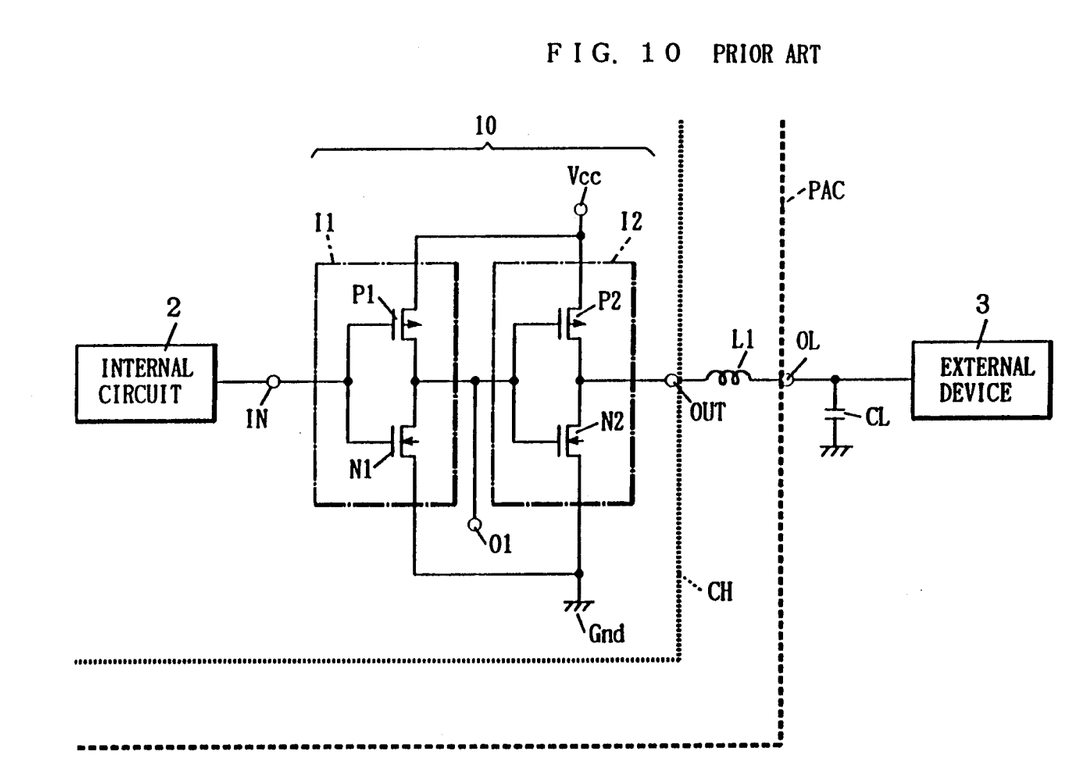
FIG. 10 is a circuit diagram showing a construction of a conventional output buffer circuit.

FIG. 10 is a circuit diagram showing a construction of a conventional output buffer circuit. This output buffer circuit has been widely used in complementary metal oxide semiconductors (will as called as "CMOSs" hereinafter) using P-channel type metal oxide semiconductor field effect transistors (will be called as "P-channel type MOS field effect transistors" hereinafter) and N-channel type metal oxide semiconductor field effect transistors (will be called as "N-channel type MOS field effect transistors" hereinafter).

In FIG. 10, an output buffer circuit 10 includes first and second CMOS inverters I1 and I2. First CMOS inverter I1 includes a P-channel type MOS field effect transistor P1 and an N-channel type MOS field effect transistor N1. Second CMOS inverter I2 includes a P-channel type MOS field effect transistor P2 and an N-channel type MOS field effect transistor N2.

Transistor P1 is connected between a power supply terminal Vcc for receiving a positive power supply potential (e.g., +5 V) and an output node O1. Transistor N1 is connected between a ground terminal Gnd for receiving a grand potential (0 V) and an output node O1. Gates of transistors P1 and N1 are connected to an input terminal IN. Transistor P2 is connected between power supply terminal Vcc and an output terminal OUT. Transistor N2 is connected between ground terminal Gnd and output terminal OUT. Gates of transistors P2 and N2 are connected to output node O1.

Substrates (sources) of transistors P1 and P2 are connected to power supply terminal Vcc. Substrates (sources) of transistors N1 and N2 are connected to grand terminal Gnd.

Input terminal IN is connected to an internal circuit 2. Internal circuit 2 and an output buffer circuit 10 is formed on a semiconductor chip CH. Output terminal OUT is wire-bonded to an external lead (external output terminal) OL of a package PAC. External lead OL is connected to an external element 3 of other LSI.

"Li" indicates an inductance, which is parasitically accompanied to an aluminium wire and a package internal interconnection line. "CL" indicates an external load capacity existing between external lead OL and external element 3, and includes an input capacity of external element 3, an interconnection line capacity and a package capacity of package PAC.

An operation of output buffer circuit in FIG. 10 will be described below with reference to an operation waveform diagram of FIG. 11.

When an input signal of "H" (e.g., +5 V) is applied to input terminal IN, transistor P1 is cut off, and transistor N1 is turned on. Thereby, output node O1 is short-circuited to grand terminal Gnd through transistor N1, and an output signal of output node O1 becomes "L" (ground potential). Thus, transistor P2 is turned on, and transistor N1 is cut off. Thereby, an output signal of output terminal OUT becomes "H" (+5 V).

Conversely, when input signal of "L" (e.g., 0 V) is applied to input terminal IN, transistor P1 is turned on, and transistor N1 is cut off. Thereby, output node O1 is short-circuited to power supply terminal Vcc through transistor P1, and output signal of output node O1 becomes "H" (+5 V). Thus, transistor P2 is cut off, and transistor N2 is turned on. Thereby, the output signal of output terminal OUT becomes "L".

Figure 11:
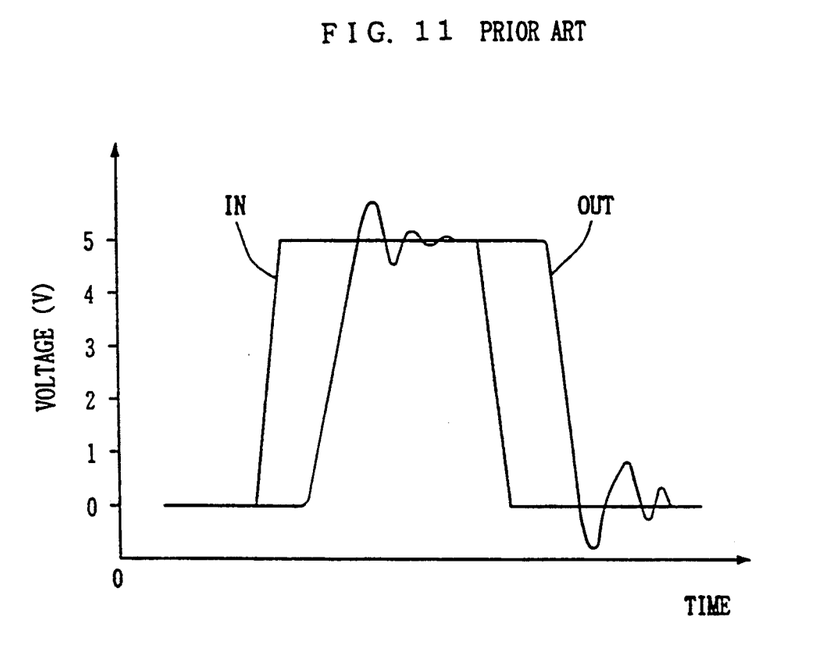
FIG. 11 is a waveform diagram of an output buffer circuit in FIG. 10.

In this manner, the input signal applied to input terminal IN is delayed for a delay time of output buffer circuit 10, as shown in FIG. 11, and the output signal of the same polarity as the input signal is obtained at output terminal OUT.

In FIG. 11, an abscissa represents a time, and an ordinate represents a voltage. "IN" represents a waveform of the input signal at input terminal IN, and "OUT" represents a waveform of the output signal at output terminal OUT.

Propagation delay times of first and second CMOS inverters I1 and I2 in the conventional output buffer circuit described above are determined by charging-/discharging times of a load capacitance (output capacitance), which is primarily formed of a stray capacitance of the circuit, an input capacitance of a gate at a subsequent stage and others. The charging/discharging times are proportional to a product of a value of output capacitance CL and a value of ON-resistance of transistor P2 or N2.

Therefore, assuming that output capacitance CL has a constant value, the delay time of the second CMOS inverter I2 is determined by the ON-resistance of transistor P2 or N2.

In the output buffer circuit for driving a large current, it is necessary to design transistor P2 or N2 to have a small ON-resistance. This reduces the charging or discharging time of output capacitance CL of the output buffer circuit, i.e., a rising or falling time of the output voltage, resulting in rapid rising or falling of the output voltage waveform.

In addition to output capacitance CL, inductance L1 is added to output terminal OUT. Further, undershoot is caused in the output waveform during the falling operation, and overshoot is caused in the output waveform during the rising operation, because an impedance of output buffer circuit 10 is not matched with an impedance of the external circuit. Particularly, since an interface at a TTL level has a logical threshold of about 1.6 V which is close to the ground potential, wrong operation of external equipments may be caused due to the undershoot.

Owing to the recent development of the fine working technology, the semiconductor devices have been highly integrated, and operation speeds of gates in the integrated circuits have increased, whereby the responsibility of the output buffer circuits has also increased. This increases the significance of the above problem.

SUMMARY OF THE INVENTION

It is an object of the invention to provide an output buffer circuit, in which undershoot and overshoot generated in an output waveform are reduced.

It is another object of the invention to provide an output buffer circuit, in which undershoot and overshoot generated in an output waveform are reduced and an operation speed is improved.

An output buffer circuit according to the invention comprises an input terminal, an external output terminal, and a plurality of buffers. The buffers are connected in parallel between the input terminal and the external output terminal, and have respectively different current driving capabilities.

In the output buffer circuit, rising and falling of an output signal of the buffer having a small current driving capability are slower than rising and falling of an output signal of the buffer having a large current driving capability. Therefore, the overshoot and undershoot generating in the output signal of the buffer having the large current driving capabilities is canceled by the output signal of the buffer having the small current driving capability.

Therefore, ringing caused by the overshoot and undershoot in the output signal can be suppressed without applying significant influence to rising and falling times of the output signal. Consequently, malfunction of external equipments can be prevented.

An output buffer circuit according to another aspect of the invention, comprises an input node for receiving an input signal at a first or second logical level, an output node for supplying an output signal, a first power supply terminal for receiving a first potential corresponding to the first logical level, a second power supply terminal for receiving a second potential corresponding to the second logical level, an inverter for inverting the logical level of the input signal of the input node, a first bipolar transistor, a switching circuit and a second bipolar transistor.

The first bipolar transistor is coupled between the first power supply terminal and the output node, and is responsive to an output signal of the inverter to be turned on when the input signal changes from the first logical level to the second logical level. The switching circuit is coupled between the second power supply terminal and the output node, and is turned on when the input signal changes from the second logical level to the first logical level. The second bipolar transistor is couple between the input node and the second power supply terminal, and sets the potential of the output signal of the inverter so as to turn on the first bipolar transistor when the output signal of the output node becomes close or equal to the second logical level.

In the output buffer circuit, when the output signal which is being changed by the switching circuit from the first logical level to the second logical level becomes close or equal to the second logical level, the second bipolar transistor operates to turn on the first bipolar transistor. Thereby, the output signal is restrained from exceeding the second logical level.

Therefore, ringing caused by the overshoot or undershoot in the output signal can be reduced without significantly affecting the rising and falling times of the output signal. Consequently, malfunction of external equipments can be prevented.

In the output buffer circuit, when the output signal changes from the first logical level to the second logical level, a current flows between the output node and the second power supply terminal through the second bipolar transistor. Therefore, an operation speed is increased when the output signal changes from the first logical level to the second logical level.

The output buffer circuit may additionally comprise a third bipolar transistor. The third bipolar transistor is connected between the output node and the second power supply terminal, and is turned on for a predetermined period of time while the output signal of the output node is changing from the first logical level to the second logical level.

In the output buffer circuit, while the output signal is changing from the first logical level to the second logical level, the switching circuit is turned on, and the third bipolar transistor is turned on for the predetermined period. Therefore, the current driving capability increases while the output signal is changing from the first logical level to the second logical level.

The output buffer circuit may comprise a resistor, which is connected between the output node and a base of the first bipolar transistor.

In the output buffer circuit, the resistor equalizes the first logical level of the output signal to the first potential.

The output buffer circuit may comprise a second switching circuit, which is connected between the output node and the first power supply terminal and is turned on when the output signal of the output node exceeds the first logical level.

In the output buffer circuit, when the output signal exceeds the first logical level, the second switching circuit is turned on. This restrains the output signal from exceeding the first logical level. Therefore, ringing due to both the undershoot and overshoot is suppressed.

The foregoing and other objects, features, aspects and advantages of the present invention will become more apparent from the following detailed description of the present invention when taken in conjunction with the accompanying drawings.

DETAILED DESCRIPTION OF THE PREFERRED EMBODIMENT (1) First Embodiment

Figure 1:
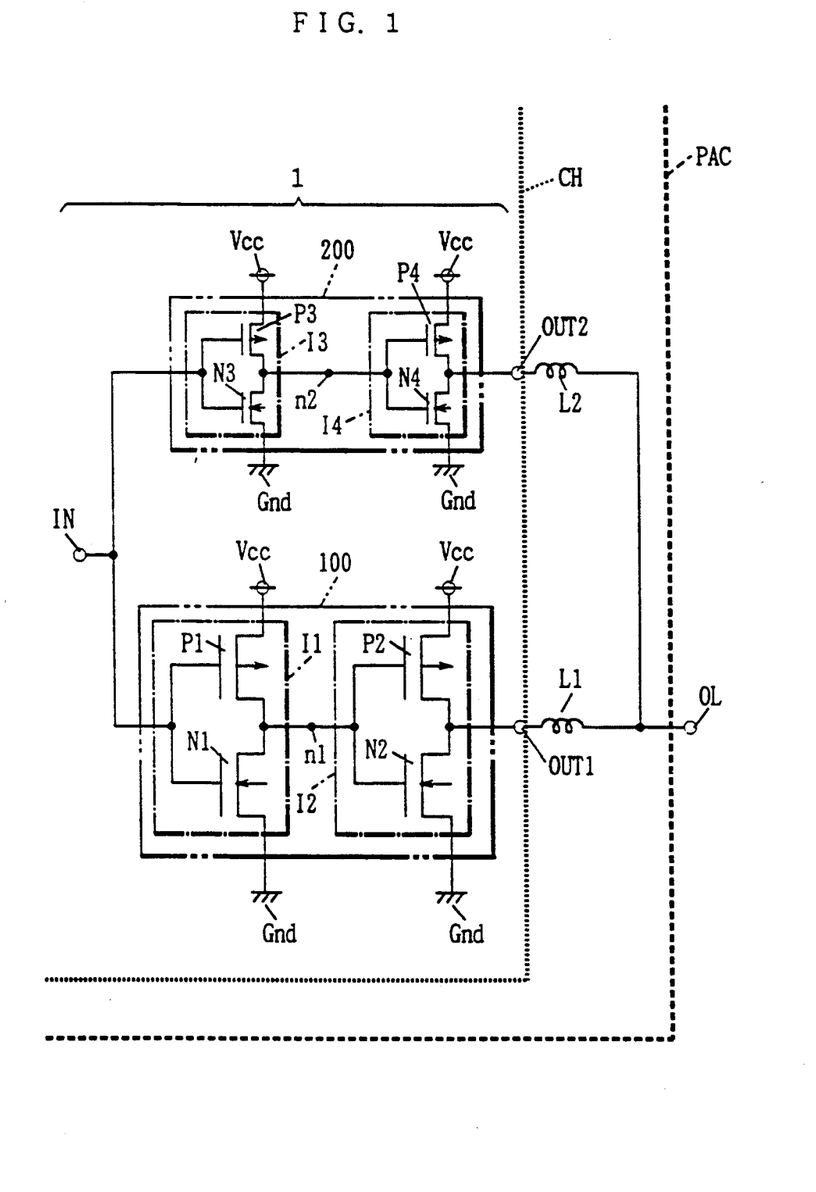
FIG. 1 is a circuit diagram showing a construction of an output buffer circuit according to a first embodiment of the invention.

FIG. 1 is a circuit diagram showing a construction of an output buffer circuit according to a first embodiment of the invention.

In FIG. 1, an output buffer circuit 1 includes first and second output buffers 100 and 200. First output buffer 100 includes first and second CMOS inverters I1 and I2. Second output buffer 200 includes third and fourth CMOS inverters I3 and I4.

First CMOS inverter I1 includes a P-channel type MOS field effect transistor P1 and an N-channel type MOS field effect transistor N1. Second CMOS inverter I2 includes a P-channel type MOS field effect transistor P2 and an N-channel type MOS field effect transistor N2. Third CMOS inverter I3 includes a P-channel type MOS field effect transistor P3 and an N-channel type MOS field effect transistor N3, and fourth CMOS inverter I4-includes a P-channel type MOS field effect transistor P4 and an N-channel type MOS field effect transistor N4.

Substrates (sources) of transistors P1, P2, P3 and P4 are connected to a power supply terminal Vcc, and substrates (sources) of transistors N1, N2, N3 and N4 are connected to a ground terminal Gnd.

Design sizes of transistors P3, P4, N3 and N4 are smaller than those of transistors P1, P2, N1 and N2. For example, transistors P3 and P4 each have a gate width of 80 $\mu$m, and transistors P1 and P2 each have a gate width of 600 $\mu$m. Further, the transistors N3 and N4 each have a gate width of, e.g., 40 $\mu$m and transistors N1 and N2 each have a gate width of, e.g., 300 $\mu$m. Transistors P1-P4 and N1-N4 each have a gate length of 0.8 $\mu$m. The gate width of each transistor in the first output buffer 100 is set to be five or more times as large as the gate width of each transistor in the second output buffer 200. Thereby, the current driving capability of the second output buffer 200 is smaller than the current driving capability of the first output buffer 100.

Output buffer circuit 1 is formed on a semiconductor chip CH. First output buffer 100 is connected between an input terminal IN and an output terminal OUT1, and second output buffer 200 is connected between input terminal IN and an output terminal OUT2. Output terminals OUT1 and OUT2 are connected to an external lead (external output terminal) OL of a package PAC through an aluminium wire and a package internal interconnection line. An inductance L1 is accompanied to the package internal interconnection line and the aluminium wire between output terminal OUT1 and external lead OL. An inductance L2 is accompanied to the package internal interconnection line and the aluminium wire between output terminal OUT2 and external lead OL.

Figure 2:
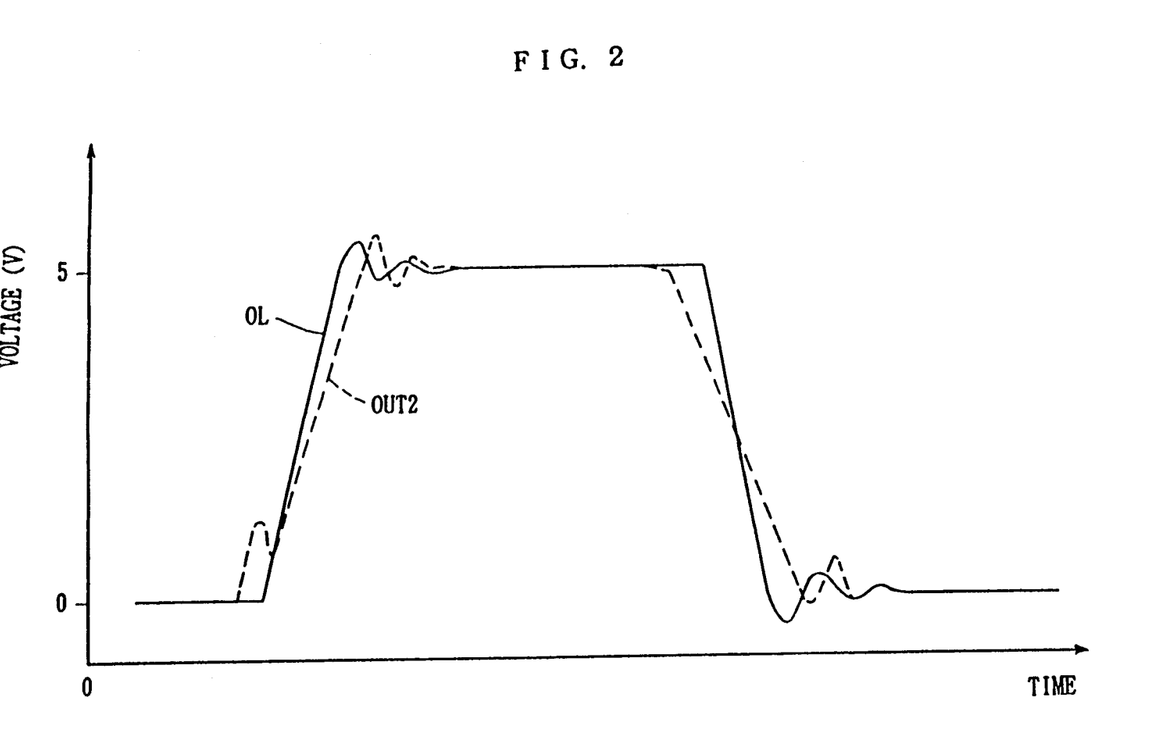
FIG. 2 is a waveform diagram of an output buffer circuit in FIG. 1.

Now, an operation of the output buffer circuit in FIG. 1 will be described below with reference to a waveform diagram of FIG. 2.

When an input signal at input terminal IN falls from "H" (e.g., +5 V) to "L" (0 V), transistors P1 and P3 are turned on, and transistors N1 and N3 are cut off. Thus, potentials of an input node n1 of the second CMOS inverter I2 and an input node n2 of fourth CMOS inverter I4 fall. Therefore, transistors P2 and P4 are cut off, and transistors N2 and N4 are turned on.

As a result, a potential of external lead OL falls to "L" (0 V). This may cause an undershoot in an output waveform. In this operation, the falling of the output signal of output terminal OUT2 is slower than the falling of the output signal of output terminal OUT1, because the current driving capability of the second output buffer 200 is smaller than the current driving capability of the first output buffer 100.

Therefore, the undershoot generating in the output signal of the output terminal OUT1 is canceled by the output signal of the output terminal OUT2. Consequently, the undershoot in the output signal of the external lead OL is reduced, and thus the potential of the external lead OL is immediately stabilized to be 0 V.

Meanwhile, when the input signal of the input terminal IN rises from "L" to "H", the potential of external lead OL rises to "H" (+5 V). This may cause the overshoot in the output waveform. In this case, the rising of the output signal of output terminal OUT2 is slower than the rising of the output signal of output terminal OUT1, because the current driving capability of the second output buffer 200 is smaller than the current driving capability of the first output buffer 100.

Therefore, the overshoot generating in the output signal of the output terminal OUT1 is canceled by the output signal of the output terminal OUT2. Consequently, the overshoot in the output signal of the external lead OL is reduced, and thus the potential of the external lead OL is immediately stabilized to be 5 V.

As described above, in the first embodiment, since second output buffer 200 having the small current driving capability is connected in parallel to first output buffer 100 having the large current driving capability, a counter electromotive force generated by the first output buffer 100 having the large current driving capability is canceled by second output buffer 200 having the current driving capability. As a result, the undershoot and overshoot generating in external lead OL of package PAC, i.e., in the external output terminal of the semiconductor integrated circuit device can be reduced.

In the above embodiment, two output buffers having different current driving capabilities are connected in parallel. However, three or more output buffers having different current driving capabilities may be connected in parallel.

(2) Second Embodiment

Figure 3:
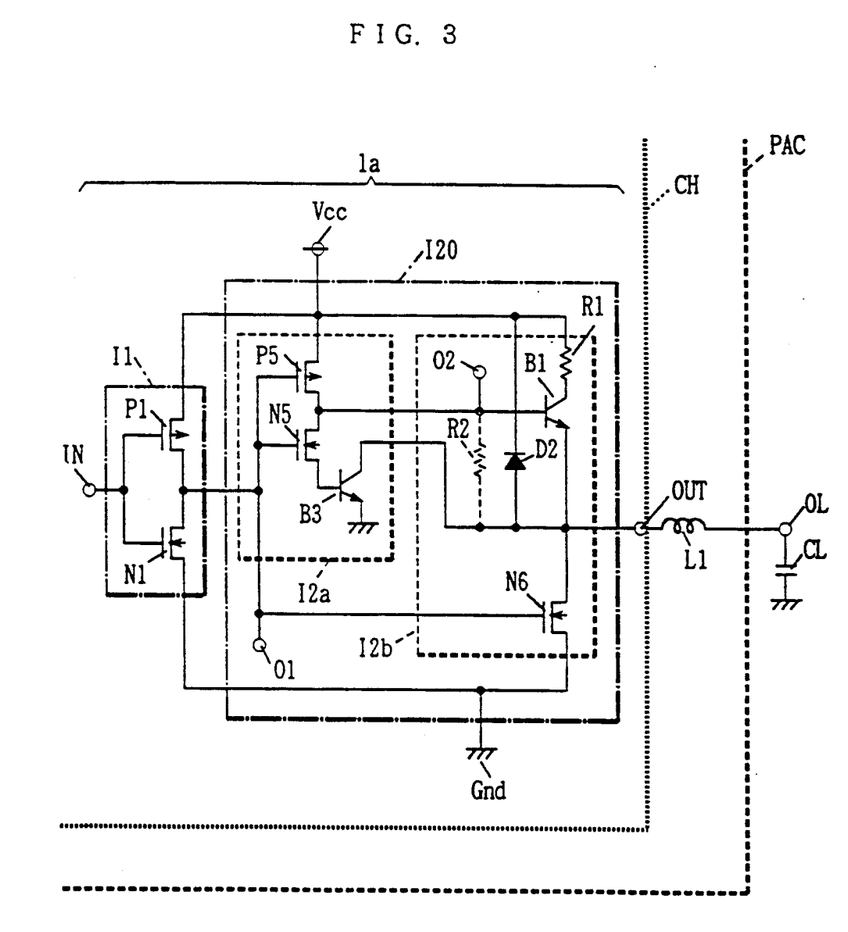
FIG. 3 is a circuit diagram showing a construction of an output buffer circuit according to a second embodiment of the invention.

FIG. 3 is a circuit diagram showing a construction of an output buffer circuit according to a second embodiment of the invention.

In FIG. 3, an output buffer circuit 1a includes a CMOS inverter I1 and a BiCMOS inverter I20. CMOS inverter I1 has the same construction as CMOS inverter I1 shown in FIG. 9.

BiCMOS inverter I20 includes an inverter block I2a and an output block I2b.

Inverter block I2a includes a P-channel type MOS field effect transistor P5, N-channel type MOS field effect transistor N5 and a bipolar transistor B3. Transistor P5 is connected between power supply terminal Vcc and output node O2, and transistor N5 is connected between output node O2 and a base of bipolar transistor B3. Gates of transistors P5 and N5 are connected to input node O1. A collector of bipolar transistor B3 is connected to output terminal OUT and emitter thereof is connected to ground terminal Gnd.

Output block I2b includes a resistor R1, a bipolar transistor B1, an N-channel type MOS field effect transistor N6 and a diode D2. Bipolar transistor B1 has a base connected to output node O2, a collector connected to power supply terminal Vcc through resistor R1, and an emitter connected to an output terminal OUT. Transistor N6 is connected between output terminal OUT and grand terminal Gnd. A gate of transistor N6 is connected to input node O1.

As shown by broken line, a resistor R2 may be connected between output node O2 and output terminal OUT.

Figure 4:
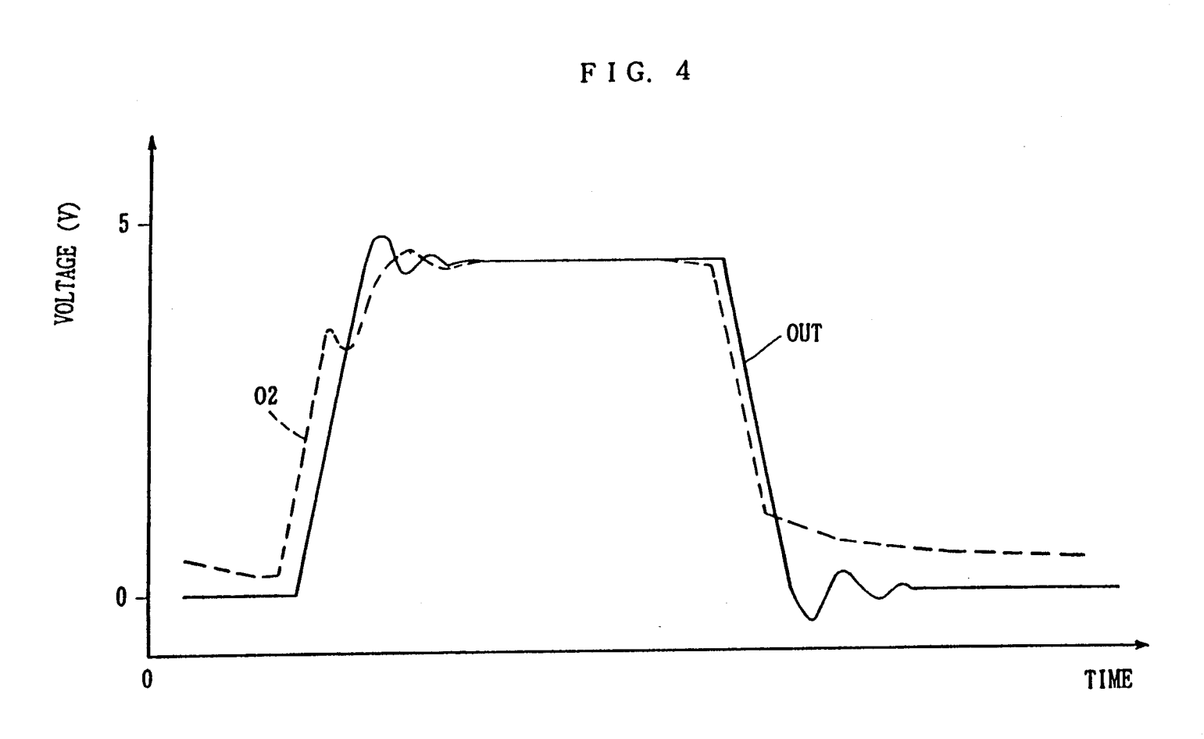
FIG. 4 is a waveform diagram of an output buffer circuit in FIG. 3.

Referring to a waveform diagram of FIG. 4, an operation of the output buffer circuit in FIG. 3 will be described below. An operation of CMOS inverter I1 is similar to that of CMOS inverter I1 shown in FIG. 9. Therefore, following description will be made with respect to an operation of BiCMOS inverter I20.

When the input signal of input node 01 is "L" (0 V), transistor P5 is turned on, and transistor N5 is turned off. Thus, the potential of the output node 02 is "H" (about 5 V). Also, the transistor N6 is turned off in this condition.

Since a voltage of about 5 V at output node 02 is applied to the base of bipolar transistor B1, the potential of output terminal OUT is about 4.2 V, which is a value reduced by a forward voltage $V_{BE}$ of bipolar transistor B1 from the power supply potential of 5 V.

When the input signal of input node 01 changes from "L" to "H", transistor P5 is turned off, and transistor N5 is turned on. Thereby, the output signal of output node O2 becomes "L". In this case, "L" of the output signal is about 0.7 V, which is slightly lower than forward voltage $V_{BE}$ of bipolar transistor B3.

Since the potential of about 0.7 V of output node O2 is applied to the base of the bipolar transistor B1, bipolar transistor B1 is turned off at a initial stage while the input signal is changing. Simultaneously, transistor N6 is turned on. Thereby, a charge is extracted from external load capacity CL, which is connected to external lead OL and has been charged to about 4.2 V, to ground terminal Gnd through transistor N6.

In this operation, the charge of external load capacity CL is extracted through bipolar transistor B3 in addition to transistor N6. Therefore, the change of the output signal from "H" to "L" is rapidly conducted.

When the output signal of the output terminal OUT changes from "H" to "L", inductance L1 existing between the output terminal OUT and external lead OL causes following counter electromotive force expressed by a following equation.

$$V = -L \cdot di / dt \quad (1)$$

wherein "L" represents an inductance, "i" represents a current and "t" represents a time.

This counter electromotive force acts to reduce the potential of output terminal OUT in the negative direction. However, when the potential of the output terminal OUT changes to 0 V due to discharging of the charge, bipolar transistor B1 has the base potential of about 0.7 V. This turns on the bipolar transistor B1. Consequently, the current is supplied from power supply terminal Vcc through bipolar transistor B1 to output terminal OUT, and the potential of output terminal OUT is prevented from reducing in the negative direction below 0 V. Therefore, the undershoot is suppressed.

When the input signal of input node 01 changes from "H" to "L", transistor P5 is turned on, and transistor N5 is turned off. Thus, the output signal of output node 02 become "H" (+5 V). Simultaneously, transistor N6 is turned off. Therefore, external load capacity CL, which is connected to external lead OL and has been discharged to 0 V, is charged through bipolar transistor B1.

In this operation, inductance L1 affects to increase the potential of output terminal OUT above the power supply potential of 5 V. However, diode D2 is turned on when the potential of output terminal OUT exceeds 5 V + $V_{BE}$(D2). Here, $V_{BE}$(D2) represents the forward voltage of the diode D2. Thereby, excessive increase of the potential of output terminal OUT is prevented, and thus the overshoot is suppressed.

If resistor R2 is connected as shown by broken line in FIG. 3, "H" of the output signal of output terminal OUT becomes +5 V.

(3) Third Embodiment

Figure 5:
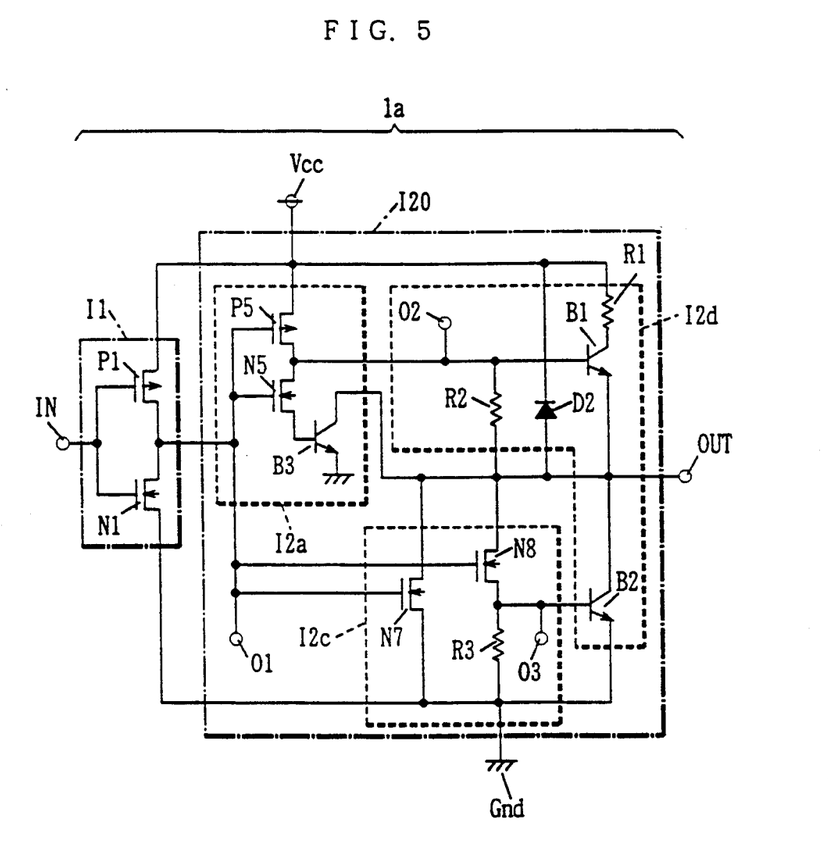
FIG. 5 is a circuit diagram showing a construction of an output buffer circuit according to a third embodiment of the invention.

FIG. 5 is a circuit diagram showing a construction of an output buffer circuit according to a third embodiment of the invention.

In FIG. 5, a BiCMOS inverter I20 includes an inverter block I2a, a control block I2c and a totem pole block I2d. Inverter block I2a has a construction similar to that of inverter block I2a shown in FIG. 3.

Totem pole block I2d includes resistors R1 and R2, a bipolar transistor B1 at a pull-up side, a bipolar transistor B2 at a pull-down side and a diode D2. Bipolar transistor B2 has a base connected to an output node O3, a collector connected to output terminal OUT and an emitter connected to ground terminal Gnd.

Control block I2c includes a resistor R3 as well as N-channel type MOS field effect transistors. N7 and N8. Transistor N7 corresponds to transistor N6 in FIG. 3. Transistor N8 is connected between output terminal OUT and output node O3. A gate of transistor N8 is connected to input node O1. Resistor R3 is connected between output node O3 and grand terminal Gnd.

In the third embodiment, bipolar transistor B2 improves the current driving capability.

When the input signal of input node O1 is "L", transistor P5 is turned on, and transistor N5 is turned off. Thus, the output signal of output node O2 is "H" (about 5 V). In this condition, transistors N7 and N8 are turned off. Consequently, the potential of output terminal OUT is "H" (+5 V).

When the input signal of input node 01 changes from "L" to "H", transistor P5 is turned off, and transistors N5 is turned on. Thus, the output signal of output node N2 is "L" (about 0.7 V). In an initial stage during the change of the input signal, bipolar transistor B1 is turned off. Simultaneously, transistors N7 and N8 are turned on.

Consequently, the charge is extracted from the external load capacity, which is connected to external lead OL and has been charged to 5 V, through transistor N7 and bipolar transistor B2 to ground terminal Gnd. In this operation, the charge in external load capacity CL is extracted also through bipolar transistor B3. Therefore, the current driving capability is improved, and the operation speed is increased.

When the potential of output terminal OUT changes to about 1 V owing to the discharging of the charge, bipolar transistor B2 is turned off. When the potential of output terminal OUT changes to 0 V, bipolar transistor B1 is turned on. Thereby, the undershoot in the output signal is suppressed.

When the input signal of input node O1 changes from "H" to "L", transistor P5 is turned on, and transistor N5 is turned off. Thereby, the output signal of output node O2 changes to "H" (+5 V). Simultaneously, transistors N7 and N8 are turned off.

Consequently, external load capacity CL, which is connected to external lead OL and has been discharged to 0 V, is charged through bipolar transistor B1. When the potential of output terminal OUT increases above 5 V + $V_{BE}$(D2), diode D2 is turned on, so that the overshoot in the output signal is suppressed.

(4) Fourth Embodiment

Figure 6:
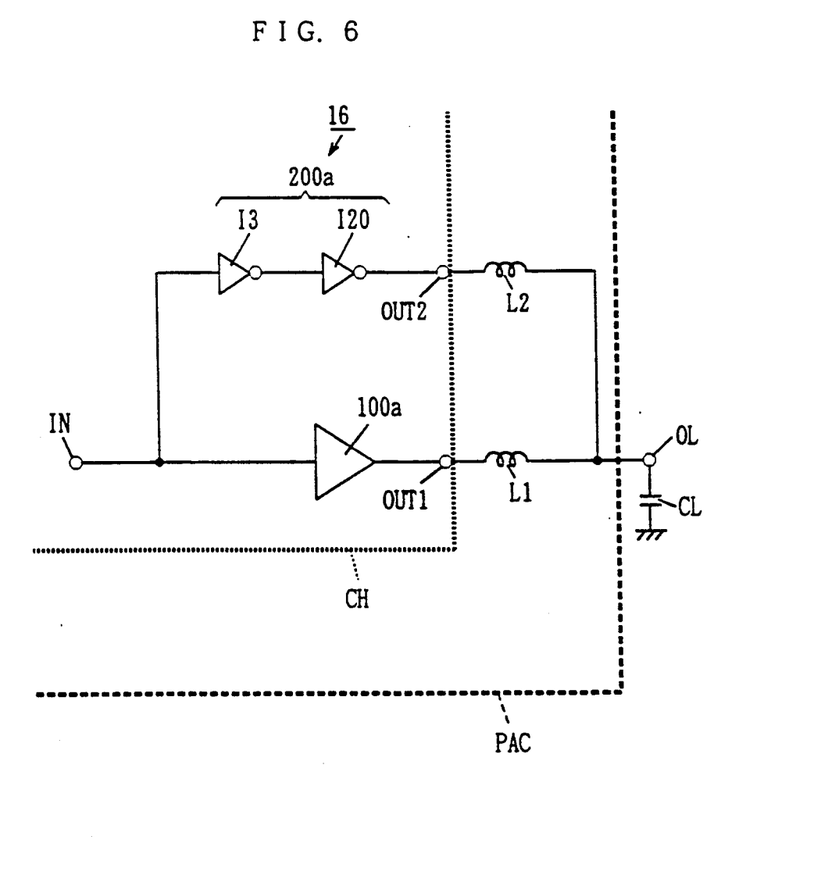
FIG. 6 is a circuit diagram showing a construction of an output buffer circuit according to a fourth embodiment of the invention.

FIG. 6 is a circuit diagram showing a construction of an output buffer circuit according to a fourth embodiment of the invention.

In FIG. 6, an output buffer circuit 1b includes first and second output buffers 100a and 200a. First output buffer 100a is connected between input terminal IN and output terminal OUT1. Second output buffer 200a is connected between input terminal IN and output terminal OUT2. First output buffer 200a includes a CMOS inverter I3 and an inverter I20.

First output buffer 100a has a construction which is similar to one of the constructions of output buffer circuits 100, 1a and 1a respectively shown in FIGS. 1, 3 and 5. CMOS inverter I3 has a construction similar to that of third CMOS inverter I3 shown in FIG. 1. Inverter I20 has a construction similar to one of the constructions of fourth CMOS inverter I4 shown in FIG. 1, BiCMOS inverter I20 shown in FIG. 3 and BiCMOS inverter I20 shown in FIG. 5.

Each transistor contained in second output buffer 200a has a gate width smaller than that of each transistor contained in first output buffer 100a. Thereby, second output buffer 200a has a current driving capability smaller than that of first output buffer 100a.

According to the fourth embodiment, the overshoot and undershoot in the output signal is further reduced, as compared with the first, second and third embodiments.

Figure 7:
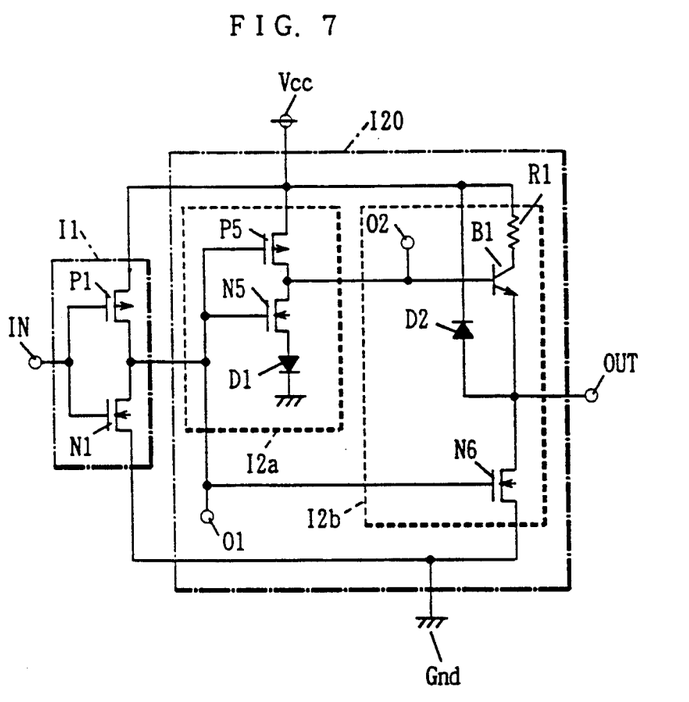
FIG. 7 is a circuit diagram showing an example of a construction of an output buffer used in an output buffer circuit in FIG. 6.
Figure 8:
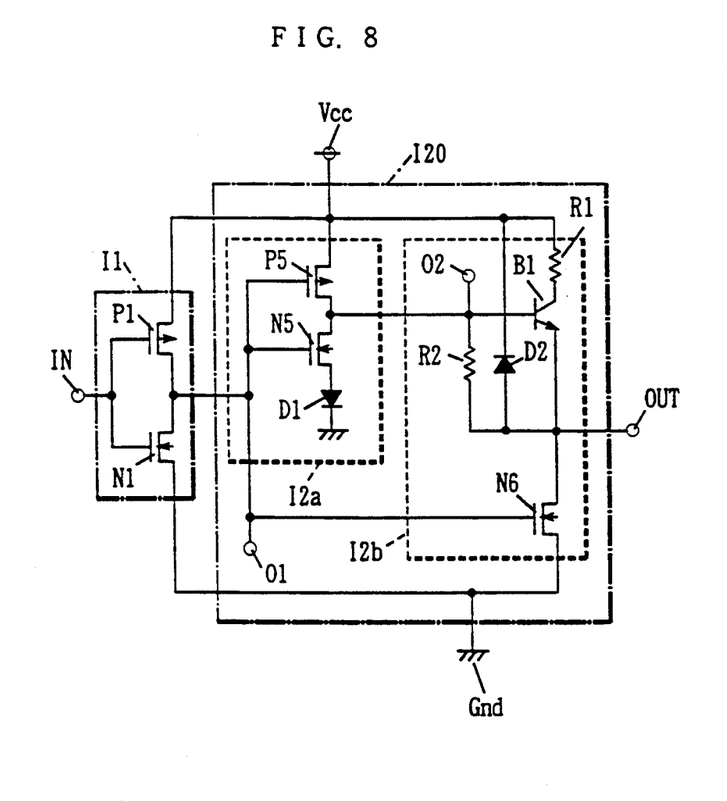
FIG. 8 is a circuit diagram showing another example of a construction of an output buffer used in an output buffer circuit shown in FIG. 6.
Figure 9:
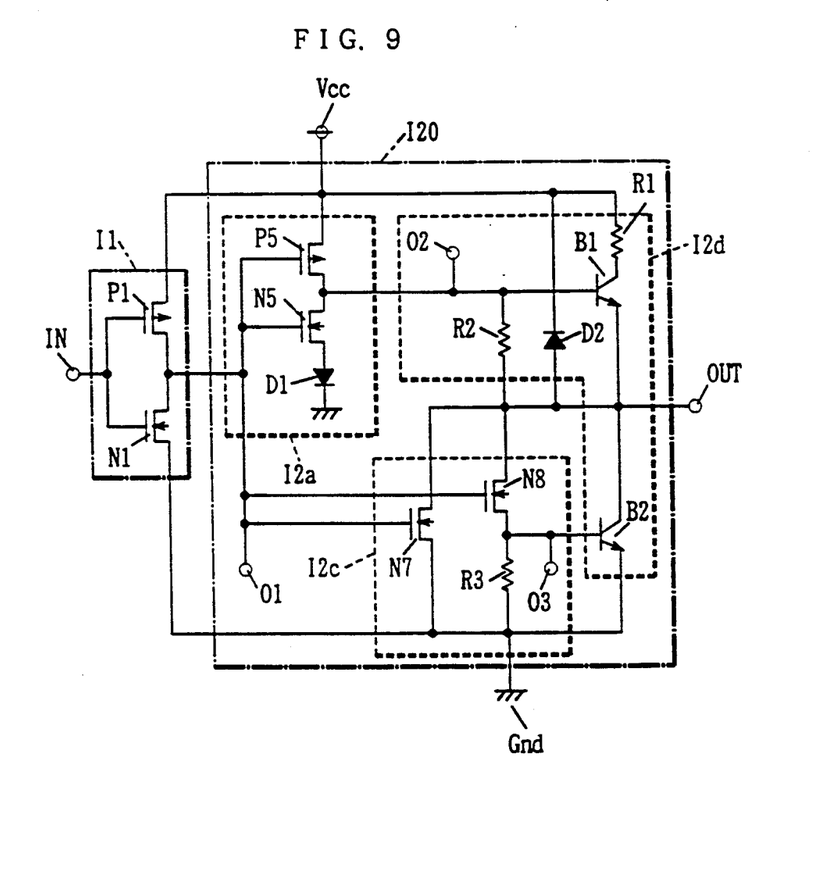
FIG. 9 is a circuit diagram showing still another example of a construction of an output buffer used in an output buffer circuit shown in FIG. 6.

One of output buffers shown in FIGS. 7, 8 and 9 may be used as first output buffer 100a or second output buffer 200a contained in output buffer circuit 1b in FIG. 6.

In the output buffer in FIG. 7, a diode D1 is used in place of bipolar transistor B3 in output buffer circuit 1a shown in FIG. 3. In the output buffer in FIG. 7, the speed of operation in which the output signal of output terminal OUT changes from "H" to "L" is slightly reduced, as compared with the output buffer circuit 1a in FIG. 3.

In the output buffer in FIG. 8, a resistor R2 is connected between output terminal O2 and output terminal OUT. In the output buffer in FIG. 7, the potential "H" of output terminal OUT is about 4.2 V which is a value reduced by forward voltage $V_{BE}$ of bipolar transistor B1 from the power supply voltage of 5 V. Meanwhile, in the output buffer in FIG. 8, the potential of "H" of the output terminal OUT is 5 V. The constructions of other portions are similar to those of the output buffer in FIG. 7.

In the output buffer in FIG. 9, a diode D1 is used in place of bipolar transistor B3 in output buffer circuit 1a in FIG. 5. In the output buffer in FIG. 9, the speed of operation in which the output signal of output terminal OUT changes from "H" to "L" is slightly reduced, as compared with the output buffer circuit 1a in FIG. 5.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An output buffer circuit, comprising:
   an input terminal;
   an output terminal;
   first and second buffer means connected in parallel between said input terminal and said output terminal and having respectively different current drive capabilities;
   said first buffer means including first and second inverter means connected in series between said input terminal and said output terminal;
   said second buffer means including third and fourth inverter means connected in series between said input terminal and said output terminal; and
   a first power supply terminal for receiving a first potential and a second power supply terminal for receiving a second potential,
   wherein each of said first and third inverter means includes:
      a first input node for receiving an input signal from said input terminal,
      a first output node,
      a first P-channel type MOS field effect transistor connected between said first power supply terminal and said first output node and having a gate connected to said first input node, and
      a first N-channel type MOS field effect transistor connected between said second power supply terminal and said first output node and having a gate connected to said first input node; and
   each of said second and fourth inverter means includes:
      a second input node for receiving an output signal from the corresponding inverter means,
      a second output node connected to said output terminal,
      a second P-channel type MOS field effect transistor connected between said first power supply terminal and said second output node and having a gate connected to said second input node, and
      a second N-channel type MOS field effect transistor connected between said second power supply terminal and said second output node and having a gate connected to said second input node,
   wherein each of said P-channel type MOS field effect transistors included in said second buffer means has a gate width smaller than that of each of said P-channel type MOS field effect transistors included in said first buffer means; and
   each of said N-channel type MOS field effect transistors included in said second buffer means has a gate width smaller than that of each of said N-channel type MOS field effect transistors included in said first buffer means.

2. The output buffer circuit according to claim 1, further comprising a first power supply terminal for receiving a first potential and a second power supply terminal for receiving a second potential; and
   and wherein each of said first and third inverter means includes:
      an input node for receiving an input signal from said input terminal,
      an output node,
      a first P-channel type MOS field effect transistor connected between said first power supply terminal and said output node and a gate connected to said input node, and
      a first N-channel type MOS field effect transistor connected between said second power supply terminal and said output node and a gate connected to said input node;
   at least one of said second and fourth inverter means includes:

an input node for receiving input signals at first and second logical levels from the corresponding inverter means, an output node for supplying an output signal, CMOS inverting means including a second P-channel type MOS field effect transistor and a second N-channel type MOS field effect transistor and for inverting the logical level of the input signal supplied from said input node, a first bipolar transistor coupled between said first power supply terminal and said output node and being responsive to an output signal of said inverting means to be turned on when the input signal of said input node changes from a first logical level to a second logical level, switching means coupled between said second power supply terminal and said output node and being turned on when the input signal of said input node changes from the second logical level to the first logical level, and potential setting means for setting a potential of an output signal of said CMOS inverting means such that said first bipolar transistor is turned on when the output signal of said output node changes close or equal to the second logical level.

3. The output buffer circuit according to claim 1, further comprising a plurality of interconnection lines connected between said plurality of buffer means and said external output terminal, each line having an inductance, associated therewith.

4. The output buffer circuit according to claim 3, further comprising a semiconductor chip mounted to a package, and wherein said input terminal and said plurality of buffer means are formed on said semiconductor chip, and said external output terminal includes an external lead attached to said package.

5. The output buffer circuit according to claim 4, wherein each of said interconnection lines includes a metal wire and a package internal interconnection line.

6. An output buffer circuit comprising:

an input node for receiving an input signal at a first or second logical level;

an output node for supplying an output signal;

a first power supply terminal for receiving a first potential corresponding to said first logical level;

a second power supply terminal for receiving a second potential corresponding to said second logical level;

inverting means for inverting the logical level of the input signal of said input node;

a first bipolar transistor coupled between said first power supply terminal and said output node and being responsive to an output signal of said inverting means to be turned on when input signal of said input node changes from a first logical level to a second logical level;

switching means coupled between said second power supply terminal and said output node and being turned on when the input signal of said input node changes from the second logical level to the first logical level; and a second bipolar transistor coupled between said output node and said second power supply terminal and for setting a potential of the output signal of said inverting means such that said first bipolar transistor is turned on when the output signal of said output node changes close or equal to the second logical level;

said inverting means including:

a P-channel type MOS field effect transistor connected between said first power supply terminal and a base of said first bipolar transistor, and having a gate connected to said input node; and an N-channel type MOS field effect transistor connected between the base of said first bipolar transistor and a base of said second bipolar transistor and having a gate connected to said input node.

7. The output buffer circuit according to claim 6, wherein said switching means includes:

a MOS field effect transistor connected between said output node and said second power supply terminal and having a gate for receiving said input signal of said input node.

8. The output buffer circuit according to claim 7, further comprising:

a third bipolar transistor connected between said output node and said second power supply terminal and being turned on in a predetermined period while the output signal is changing from the first logical level to the.. second logical level.

9. The output buffer circuit according to claim 8, further comprising:

a MOS field effect transistor connected between said output node and a base of said third bipolar transistor and having a gate for receiving the input signal of said input node; and resistor means connected between the base of said third bipolar transistor and said second power supply terminal.

10. An output buffer circuit comprising:

an input node for receiving an input signal a first or second logical level;

an output node for supplying an output signal;

a first power supply terminal for receiving a first potential corresponding to said first logical level;

a second power supply terminal for receiving a second potential corresponding to said second logical level;

inverting means for inverting the logical level of the input signal of said input node;

a first bipolar transistor coupled between said first power supply terminal and said output node and being responsive to an output signal of said inverting means to be turned on when input signal of said input node changes from a first logical level to a second logical level;

switching means coupled between said second power supply terminal and said output node and being turned on when the input signal of said input node changes from the second logical level to the first logical level;

a second bipolar transistor coupled between said output node and said second power supply terminal and for setting a potential of the output signal of said inverting means such that said first bipolar transistor is turned on when the output signal of aid output ode changes close or equal to the second logical level; and resistor means connected between said output node and the base of said first bipolar transistor.

11. An output buffer circuit comprising:

an input node for receiving an input signal of a first or second logical level;

an output node for supplying an output signal;

a first power supply terminal for receiving a first potential corresponding to said first logical level;

a second power supply terminal for receiving a second potential corresponding to said second logical level;

inverting means for inverting the logical level of the input signal of said input node;

a first bipolar transistor coupled between said first power supply terminal and said output node and being responsive to an output signal of said inverting means to be turned on when input signal of said input node changes from a first logical level to a second logical level;

switching means coupled between said second power supply terminal and said output node and being turned on when the input signal of said input node changes from the second logical level to the first logical level;

a second bipolar transistor coupled between said output node and said second power supply terminal and for setting a potential of the output signal of said inverting means such that said first bipolar transistor is turned on when the output signal of said output node changes close or equal to the second logical level; and second switching means which is connected between said output node and said first power supply terminal and being turned on when an output signal of said output node exceeds the first logical level.

12. An output buffer circuit according to claim 11, wherein said second switching means includes a diode.

13. An output buffer circuit comprising:

an input node for receiving an input signal at first and second logical level;

an output node for supplying an output signal;

a first power supply terminal for receiving a first potential corresponding to said first logical level;

a second power supply terminal for receiving a second potential corresponding to said second logical level;

inverting means for inverting the logical level of the input signal of said input node;

a first bipolar transistor coupled between said first power supply terminal and said output node and being responsive to an output signal of said inverting means to be turned on when input signal of said input node changes from a first logical level to a second logical level;

switching means coupled between said second power supply terminal and said output node and being turned on when the input signal of said input node changes from the second logical level to the first logical level;

a second bipolar transistor coupled between said output node and said second power supply terminal and for setting a potential of the output signal of said inverting means such that said first bipolar transistor is turned on when the output signal of said output node changes close or equal to the second logical level; and CMOS inverter means including a P-channel type MOS field effect transistor and an N-channel type MOS field effect transistor and for inverting an input signal to apply the same to said input node.

14. An output buffer circuit, comprising:

an input terminal receiving a pulse signal of prescribed amplitude and slope;

an output terminal;

first and second buffers connected in parallel with each other between the input and output terminals so as to apply a composite output signal to said output terminal;

said first and second buffers having, respectively, first and second current drive capabilities, said first and second drive capabilities being different from and related to each other so as to apply, to said output terminal, output signal components being, respectively, underdamped and more heavily damped so as substantially to cancel any ringing component in the composite output signal; and a first power supply terminal for receiving a first potential and a second power supply terminal for receiving a second potential, wherein each of said first and second buffers include:

a first input node for receiving an input signal from said input terminal, a first output node, a first P-channel type MOS field effect transistor connected between said first power supply terminal and said first output node and having a gate connected to said first input node, a first N-channel type MOS field effect transistor connected between said second power supply terminal and said first output node and having a gate connected to said first input node, a second input node connected to the first output node, a second output node connected to said output terminal, a second P-channel type MOS field effect transistor connected between said first power supply terminal and said second output node and having a gate connected to said second input node, and a second N-channel type MOS field effect transistor connected between said second power supply terminal and said second output node and having a gate connected to said second input node wherein each of said P-channel type MOS field effect transistors included in said second buffer means has a gate width smaller than that of each of said P-channel type MOS field effect transistors included in said first buffer means; and each of said N-channel type MOS field effect transistors included in said second buffer means has a gate width smaller than that of each of said N-channel type MOS field effect transistors included in said first buffer means.

15. An output buffer circuit, comprising:

an input node;

an output node;

a first PMOS transistor and a first NMOS transistor in series with each other, each having a gate electrode and first and second source/drain electrodes, wherein the second source/drain electrode of said PMOS transistor and the first source/drain electrode of said NMOS are interconnected at a first node;

a first bipolar transistor having base, emitter and collector electrodes;

the gate electrodes of said PMOS transistor and NMOS transistor being connected to each other and coupled to the input node, and the second source/drain electrode of said NMOS transistor being connected to the base electrode of said bipolar transistor;

a second bipolar transistor having base, emitter and collector electrodes;

a second NMOS transistor having a gate electrode and first and second source/drain electrodes, the second bipolar transistor and said second NMOS transistor being in series with each other and the emitter of said second bipolar transistor and the second source/drain electrode of said second NMOS transistor interconnected at the output node;

the collector electrode of said second bipolar transistor being coupled to a first power supply node;

the first source/drain electrode of said PMOS transistor and the collector electrode of said second bipolar transistor being coupled to the first power supply node;

the emitter electrode of said first bipolar transistor and the second source/drain electrode of said second NMOS transistor being coupled to a second power supply node;

the base electrode of said second bipolar transistor being connected to said first interconnection node;

the collector electrode of said first bipolar transistor being coupled to said second interconnection node; and the gate electrode of said second NMOS transistor being coupled to the input node.

16. The circuit of claim 15, including a second PMOS transistor and a third NMOS transistor in series with each other, each having a gate electrode and first and second source/drain electrodes, wherein the second source/drain electrode of said second PMOS transistor and the first source/drain electrode of said third NMOS are interconnected at a third node, the gates of said second PMOS transistor and said third NMOS transistor are interconnected at an input terminal, the third node and input node being interconnected, and the first source/drain electrode of said second PMOS transistor and second source/drain electrode of said third NMOS transistor are connected to said first and second power supply nodes, respectively.

17. The circuit of claim 16, further including a diode connected between said output node and first power supply node.

18. An output buffer circuit, comprising:
an input node;
an output node;
a first PMOS transistor and a first NMOS transistor in series with each other, each having a gate electrode and first and second source/drain electrodes, wherein the second source/drain electrode of said PMOS transistor and the first source/drain electrode of said NMOS are interconnected at a first node;
a first bipolar transistor having base, emitter and collector electrodes;
the gate electrodes of said PMOS transistor and NMOS transistor being connected to each other and to the input node, and the second source/drain electrode of said NMOS transistor being connected to the base electrode of said bipolar transistor;

a second bipolar transistor having base, emitter and collector electrodes;

a third bipolar transistor having base, emitter and collector electrodes, the second bipolar transistor and said third transistor being in series with each other and the emitter electrode of said second bipolar transistor and the collector electrode of said third bipolar transistor interconnected and coupled to the output node;

the collector electrode of said second bipolar transistor being coupled to a first power supply node;

the first source/drain electrode of said PMOS transistor and the collector electrode of said second bipolar transistor being coupled to said first power supply node, the emitter electrodes of said first and third bipolar transistors being connected to a second power supply node;

the base electrode of said second bipolar transistor being coupled to said first node;

the collector electrode of said first bipolar transistor being coupled to said output node;

a second NMOS transistor having a gate electrode and first and second source/drain electrodes, the gate electrode of said second NMOS transistor being coupled to said input node, the first source/drain electrode of said second NMOS transistor being coupled to said output node and the second source/drain electrode of said second NMOS transistor coupled to said second power supply node and being connected to the base electrode of said third bipolar transistor; and a third NMOS transistor having a gate electrode and first and second source/drain electrodes, the gate electrode of said third NMOS transistor being coupled to said input node, and the first and second source/drain electrodes of said third NMOS transistor being coupled to the output and second power supply nodes, respectively.

19. The circuit of claim 18, including a second PMOS transistor and a fourth NMOS transistor in series with each other, each having a gate electrode and first and second source/drain electrodes, wherein the second source/drain electrode of said second PMOS transistor and the first source/drain electrode of said fourth NMOS are interconnected at a third node, the gates of said second PMOS transistor and said fourth NMOS transistor are interconnected at an input terminal, the third node and input node being interconnected and the first source/drain electrode of said second PMOS transistor and second source/drain electrode of said fourth NMOS transistor being connected to said first and second power supply nodes, respectively.

20. The circuit of claim 19, further including a diode connected between said output node and said first power supply node.

* * * * *